United States Patent
Chen et al.

(10) Patent No.: US 8,022,523 B2
(45) Date of Patent: Sep. 20, 2011

(54) MULTI-CHIP STACK PACKAGE

(75) Inventors: Jen-Chun Chen, Taipei County (TW); Wu-Der Yang, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 669 days.

(21) Appl. No.: 12/136,055

(22) Filed: Jun. 10, 2008

(65) Prior Publication Data
US 2009/0250822 A1 Oct. 8, 2009

(30) Foreign Application Priority Data
Apr. 7, 2008 (TW) ................................ 97112491 A (51) Int. Cl.
*H01L 23/02* (2006.01)
(52) U.S. Cl. ........................................ 257/686; 257/724
(58) Field of Classification Search .................. 257/686, 257/724
See application file for complete search history.

(56) References Cited

U.S. PATENT DOCUMENTS

| | | | | |
|---|---|---|---|---|
| 3,225,262 A * | 12/1965 | Myers | ............................ | 361/808 |
| 4,941,033 A * | 7/1990 | Kishida | ........................ | 257/698 |
| 5,191,404 A * | 3/1993 | Wu et al. | ........................ | 257/724 |
| 6,137,164 A * | 10/2000 | Yew et al. | ........................ | 257/686 |
| 6,861,761 B2 | 3/2005 | Yang et al. | | |
| 7,002,255 B2 | 2/2006 | Wang | | |
| 7,087,988 B2 * | 8/2006 | Hosomi | ........................ | 257/686 |
| 7,294,928 B2 * | 11/2007 | Bang et al. | .................... | 257/737 |
| 7,557,443 B2 * | 7/2009 | Ye et al. | ........................ | 257/723 |
| 7,800,212 B2 * | 9/2010 | Yoon et al. | .................... | 257/686 |
| 7,829,989 B2 * | 11/2010 | Sun et al. | ........................ | 257/686 |
| 7,843,059 B2 * | 11/2010 | Gomyo et al. | ................ | 257/723 |
| 2001/0002727 A1 * | 6/2001 | Shiraishi et al. | ............. | 257/685 |
| 2003/0094685 A1 * | 5/2003 | Shiraishi et al. | ............. | 257/686 |
| 2005/0133932 A1 * | 6/2005 | Pohl et al. | ..................... | 257/777 |
| 2010/0200975 A1 * | 8/2010 | Chino | ........................... | 257/686 |
| 2010/0219523 A1 * | 9/2010 | Chow et al. | .................. | 257/686 |

* cited by examiner

*Primary Examiner* — N Drew Richards
*Assistant Examiner* — Grant Withers
(74) *Attorney, Agent, or Firm* — Jianq Chyun IP Office (57) ABSTRACT

A multi-chip stack package comprising a first wiring substrate, a first chip, a second wiring substrate, and a second chip is provided. The first wiring substrate is with a front side and a rear side. The first chip is disposed on the front side of the first wiring substrate and electrically connected to the first wiring substrate and the first chip has a first active surface. The second wiring substrate is disposed on the first active surface of the first chip and electrically connected to the first wiring substrate. The second chip is disposed on the second wiring substrate and electrically connected to the second wiring layer. The second active surface of the second chip faces the first active surface of the first chip.

8 Claims, 6 Drawing Sheets

MULTI-CHIP STACK PACKAGE

CROSS-REFERENCE TO RELATED APPLICATION

This application claims the priority benefit of Taiwan application serial no. 97112491, filed on Apr. 7, 2008. The entirety of the above-mentioned patent application is hereby incorporated by reference herein and made a part of this specification.

BACKGROUND OF THE INVENTION

1. Field of the Invention

The present invention relates to a multi-chip stack package assembly, and particularly relates to a multi-chip stack package which has better signal transmission efficiency and requires lower fabrication costs.

2. Description of Related Art

Along with the ongoing development of electronic technology, new generations of electronic products with more complex and user-friendly functions are coming forth to replace old products. In addition, new electronic products are designed to be lighter, thinner, shorter, and smaller. Accordingly, various high-density semiconductor packages are developed in semiconductor package technology, such as multi-chip stack package.

Figure 1:
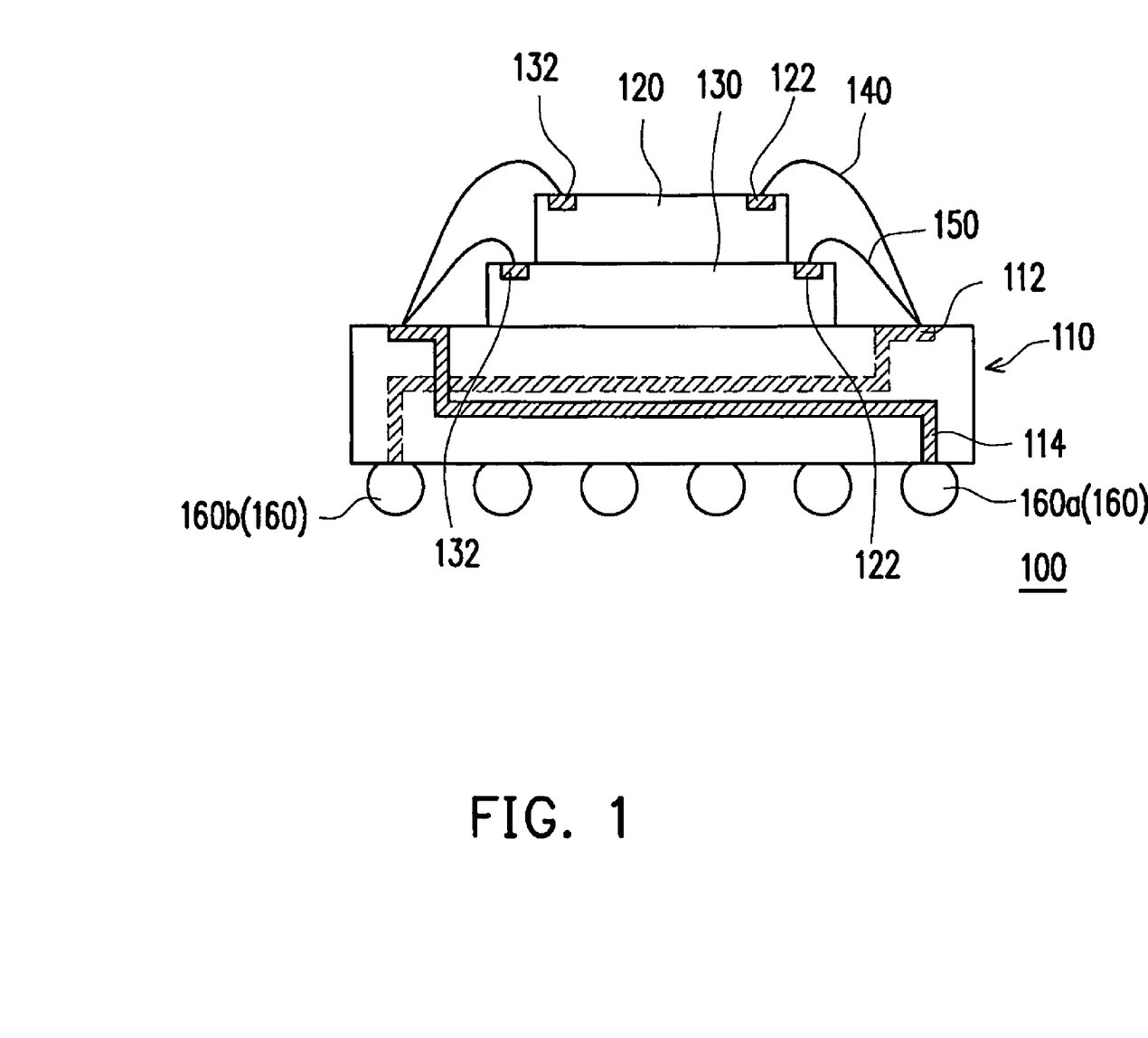
FIG. 1 is a schematic cross-sectional view of a conventional multi-chip stack package.

FIG. 1 is a schematic cross-sectional view of a conventional multi-chip stack package. Referring to FIG. 1, a multi-chip stack package 100 comprises a wiring substrate 110, a plurality of chips each having a front side provided with an active surface thereon, such as a first chip 120 and a second chip 130 which is disposed between the wiring substrate 110 and the first chip 120, a plurality of first bonding wires 140, a plurality of second bonding wires 150, and a plurality of solder balls 160. Each of the first bonding pads 122 of the first chip 120 is electrically connected to a first conductive channel 112 of the wiring substrate 110 via one of the first bonding wires 140. Each of the second bonding pads 132 of the second chip 130 is electrically connected to a second conductive channel 114 of the wiring substrate 110 via one of the second bonding wires 150. The solder balls 160 are disposed on an under surface of the wiring substrate 110 to be away from a front side of the second chip 130. As shown in FIG. 1, the first chip 120 has a front side and an active surface formed on top of the front side, and the first bonding pad 122 is disposed at the right side of the multi-chip stack package 100. Hence, the first conductive channel 112 inside the wiring substrate 110 needs to be re-routed to electrically connect the first bonding pad 122 to the solder ball 160b at the left side of the multi-chip stack package 100. Correspondingly, the second bonding pad 132 is disposed at the left side of the multi-chip stack package 100. Consequently, the second conductive channel 114 inside the wiring substrate 110 needs to be re-routed to electrically connect the second bonding pad 132 to the solder ball 160a at the right side of the multi-chip stack package 100.

However, a length of each of the first bonding wires 140 is different from a length of each of the second bonding wires 150. As a consequence, the time required for transmitting a signal from the first bonding pad 122 of the first chip 120 and of the second chip 130 to the first conductive channel 112 is different. Hence, the problem of signal delay occurs during the operation of the multi-chip stack package 100. In addition, re-routing the first conductive channel 112 and the second conductive channel 114, as described above, also causes signal delay.

To solve this problem, a conventional technique is to fabricate a redistribution layer (not shown) on the chip. After a wafer (not shown) is fabricated, a plurality of contacts (not shown) is exposed on the areas to be divided into chips. However, the contacts may not be arranged according to the designer's requirement. Hence, the redistribution layer is formed on the areas so that the exposed bonding pads can be arranged as required and electrically connected to the contacts respectively through the circuits of the redistribution layer. After the redistribution layer is completed, the wafer is then divided to form the chips.

However, the width (between 5-10 micrometers) of the circuits of the redistribution layer is becoming smaller and smaller, and the material thereof generally comprises gold, which is expensive and has bad electrical conductivity. Thus, the conventional multi-chip stack package does not provide satisfactory signal transmission efficiency and fabrication cost of such package is high. Further, in the conventional technique, the redistribution layer is formed on all the areas to be divided into chips in the wafer. However, the designer may need the redistribution layer to be formed on only a portion of the areas. For the above reason, the conventional technique reduces the utilization of the wafer and cannot satisfy the user's requirements. In addition, the redistribution layer needs to be fabricated in a clean room, which also increases the fabrication costs of the conventional multi-chip stack package.

SUMMARY OF THE INVENTION

The present invention provides a multi-chip stack package which has high signal transmission efficiency and the fabrication cost is low.

Specifically, the present invention provides a multi-chip stack package comprising a first wiring substrate, a first chip, a second wiring substrate, and a second chip. The first wiring substrate is with a front side and a rear side. The first chip is disposed on the front side of the first wiring substrate and electrically connected to the first wiring substrate and the first chip has a first active surface. The second wiring substrate is disposed on the first active surface of the first chip and electrically connected to the first wiring substrate. The second chip is disposed on the second wiring substrate and electrically connected to the second wiring layer. The second active surface of the second chip faces the first active surface of the first chip.

In an embodiment of the present invention, the first wiring substrate further comprises a first solder ball and a second solder ball disposed on the rear side of the first wiring substrate.

In an embodiment of the present invention, the first chip further comprises a first bonding pad and a second bonding pad disposed on the first active surface, wherein the first bonding pad is electrically connected to the first solder ball and the second bonding pad is electrically connected to the second solder ball. The second chip further comprises a third bonding pad and a fourth bonding pad disposed on the second active surface, wherein the third bonding pad is electrically connected to the first solder ball and the fourth bonding pad is electrically connected to the second solder ball. The first and the third bonding pads are diagonally arranged and the second and the fourth bonding pads are diagonally arranged.

In an embodiment of the present invention, the second wiring substrate further comprises a first wiring layer and a second wiring layer, the first wiring layer and the second wiring layer are respectively disposed on opposite sides of the second wiring substrate.

An embodiment of the present invention further comprises a plurality of first electrical connection elements disposed between the first chip and the second wiring substrate to electrically connect the first chip to the first wiring layer of the second wiring substrate.

In an embodiment of the present invention, each of the first electrical connection elements is a conductive bump.

An embodiment of the present invention further comprises a plurality of second electrical connection elements disposed between the second chip and the second wiring substrate to electrically connect the second chip to the second wiring layer of the second wiring substrate.

In an embodiment of the present invention, each of the second electrical connection elements is a conductive bump.

In an embodiment of the present invention, the first wiring layer is redistribution layer.

Specifically, the present invention provides a multi-chip stack package comprising a first wiring substrate, a first chip, a second wiring substrate, and a second chip. The first wiring substrate has a first solder ball and a second solder ball respectively provided on a side of the first wiring substrate. The first chip, having a first bonding pad and a second bonding pad respectively disposed on a side of the second chip, is disposed on the first wiring substrate, wherein the first bonding pad is electrically connected to the first solder ball and the second bonding pad is electrically connected to the second solder ball. The second wiring substrate is disposed on the first chip and electrically connected to the first wiring substrate. The second chip has a third bonding pad and fourth bonding pad respectively disposed on a side of the second chip. The third bonding pad is electrically connected to the first solder ball and the fourth bonding pad is electrically connected to the second solder ball. The first bonding pad and the third bonding pad are diagonally arranged and the second bonding pad and the fourth bonding pad are diagonally arranged.

Based on the above, because the second wiring substrate comprises the first wiring layer and the second wiring layer, and the first chip and the second chip are electrically connected to the first wiring substrate respectively through the first wiring layer and the second wiring layer, the first chip and the second chip do not require the additional redistribution layer according to the conventional technique. Consequently, the fabrication costs of the multi-chip stack package are lower, and the utilization of the wafer divided into the first chip and the second chip can be enhanced.

To make the above and other objectives, features, and advantages of the present invention more comprehensible, preferable embodiments accompanied with figures are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 2:
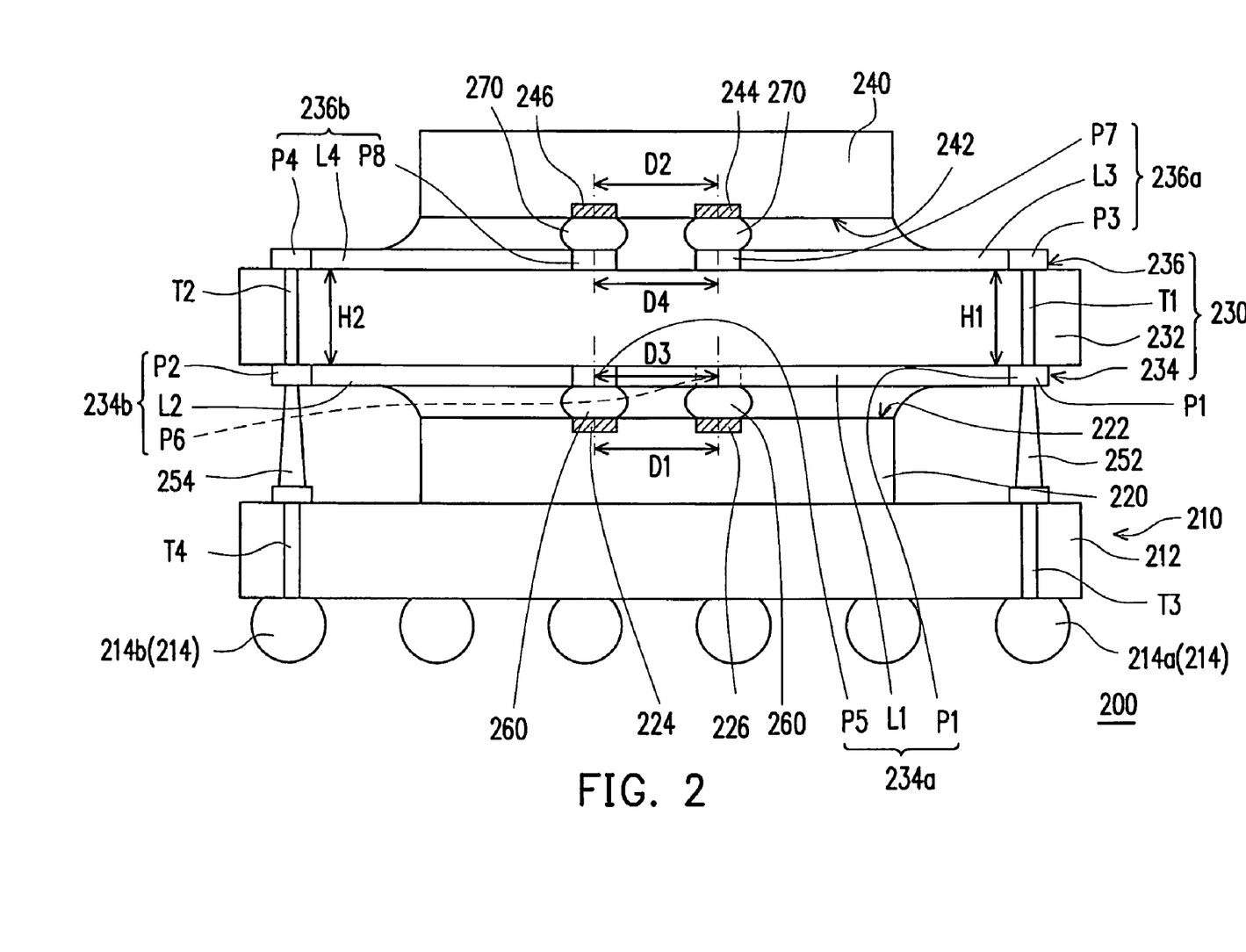
FIG. 2 is a schematic cross-sectional view of a multi-chip stack package according to an embodiment of the present invention.
Figure 3:
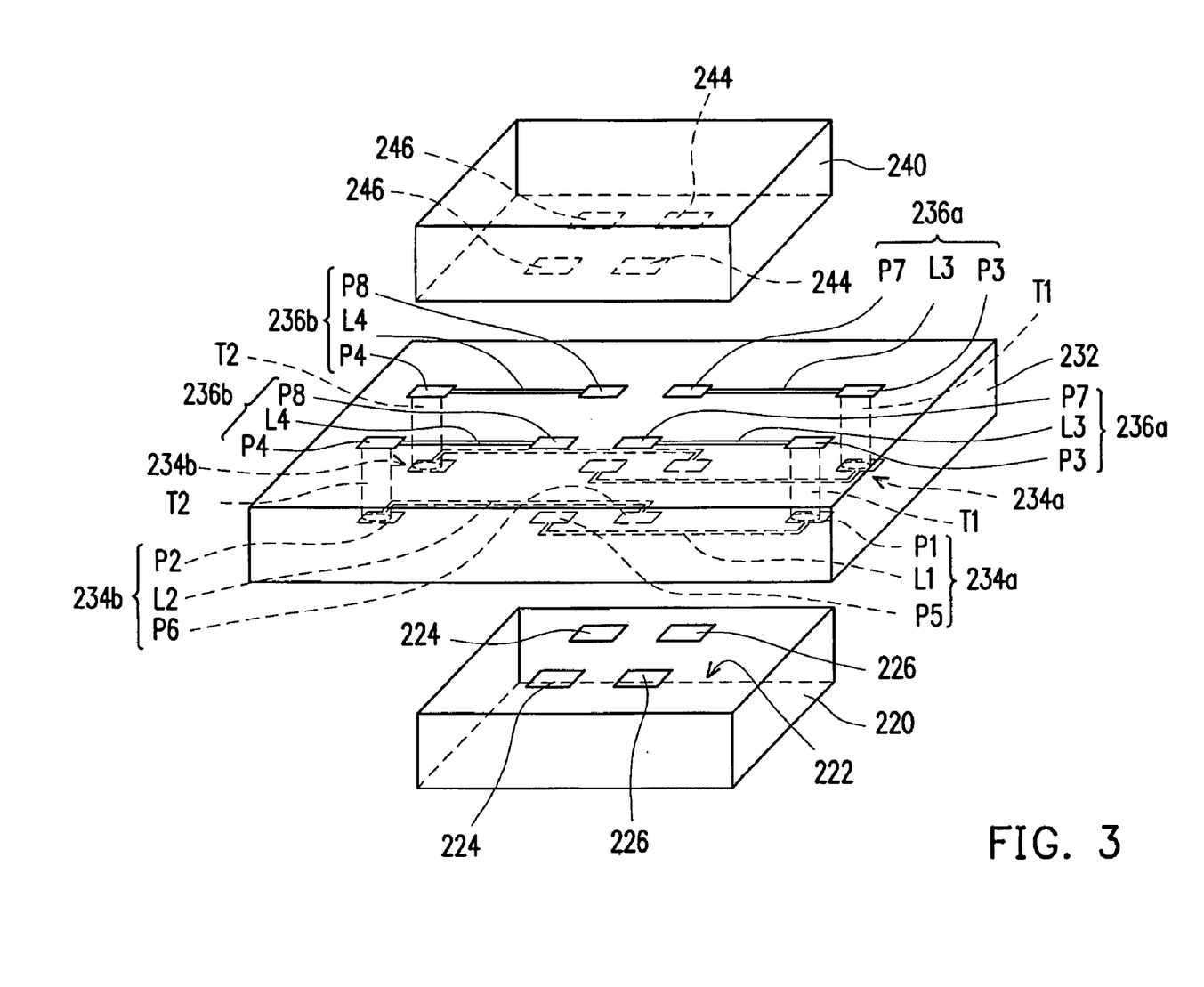
FIG. 3 is an analytic view of a first chip, a second wiring substrate, and a second chip in FIG. 2.

FIG. 2 is a schematic cross-sectional view of a multi-chip stack package according to an embodiment of the present invention. FIG. 3 is an analytic schematic view of a first chip, a second wiring substrate, and a second chip in FIG. 2.

Referring to FIG. 2 and FIG. 3, a multi-chip stack package 200 comprises a first wiring substrate 210 such as a print circuit board, a first chip 220 such as a memory chip, a second wiring substrate 230, and a second chip 240 such as a memory chip. The first chip 220 is disposed on a front side (not shown) of the first wiring substrate 210 and has a first active surface 222 which is directed to a first direction away from the first wiring substrate 210 without directly contacting the front side of the first wiring substrate 210.

The second wiring substrate 230 is disposed on the first active surface 222 of the first chip 220 and comprises a dielectric layer 232, a first wiring layer 234, and a second wiring layer 236, wherein the first wiring layer 234 is a redistribution layer, for example. The first wiring layer 234 is electrically connected to the first chip 220 and the first wiring substrate 210. The second wiring layer 236 is electrically connected to the first wiring substrate 210, and the first wiring layer 234 and the second wiring layer 236 are respectively disposed on opposite sides of the dielectric layer 232. The second chip 240 is disposed on the second wiring substrate 230 and electrically connected to the second wiring layer 236. The second chip 240 has a second active surface 242 which is directed to a second direction toward the second wiring substrate 230. The second direction and the first direction are parallel and reverse with each other, i.e. the first active surface 222 faces the first wiring layer 234 and the second active surface 242 faces the second wiring layer 236.

In this embodiment, because the second wiring substrate 230 comprises the first wiring layer 234 and the second wiring layer 236, and the first chip 220 and the second chip 240 are electrically connected to the first wiring substrate 210 respectively via the first wiring layer 234 and the second wiring layer 236 such that the first chip 220 and the second chip 240 do not require additional redistribution layer to connect to the wiring substrate as described in the background. Hence, the fabrication cost of the multi-chip stack package 200 according to this embodiment is reduced, and the utilization of the wafer divided into the first chip and the second chip can be enhanced.

Details of the multi-chip stack package 200 according to this embodiment are described as follows. In this embodiment, the multi-chip stack package 200 further comprises at least a first conductive holder 252, at least a second conductive holder 254, at least a first electrical connection element 260, and at least a second electrical connection element 270. The first wiring substrate 210 may further comprise a plurality of solder balls 214. To simplify the descriptions, only at least a first solder ball 214a and at least a second solder ball 214b are illustrated herein. The first conductive holders 252 (a material thereof comprises gold) are disposed between the second wiring substrate 230 and the first wiring substrate 210, and the second conductive holders 254 (a material thereof comprises gold) are disposed between the second wiring substrate 230 and the first wiring substrate 210 as well. The first electrical connection elements 260 (such as conductive bumps) are disposed between the first chip 220 and the second wiring substrate 230 to electrically connect the first chip 220 to the first wiring layer 234. The second electrical connection elements 270 (such as conductive bumps) are disposed between the second chip 240 and the second wiring substrate 230 to electrically connect the second chip 240 to the second wiring layer 236. The first solder ball 214a and the second solder ball 214b are disposed on the rear side of the first wiring substrate 210 and the rear side is away from the first chip 220.

The first wiring substrate 210 comprises a dielectric layer 212, at least a first conductive channel T3, and at least a second conductive channel T4. The first conductive channels T3 and the second conductive channels T4 may pass through the dielectric layer 212 so that the first conductive channels T3 electrically connect the first conductive holders 252 to the first solder ball 214a and the second conductive channels T4 electrically connect the second conductive holders 254 to the second solder ball 214b. Specifically, referring to the relative positions as shown in FIG. 2, a height of the second conductive channels T4 connecting the second conductive holders 254 to the second solder ball 214b on the left side is approximately equal to a height of the first conductive channels T3 connecting the first conductive holders 252 to the first solder ball 214a on the right side. Compared with the conventional technique, the present invention can prevent signal delay and the first conductive channels T3 and the second conductive channels T4 do not need to be re-routed in the first wiring substrate 210.

Referring to FIG. 2 and FIG. 3, the first chip 220 further comprises at least a first bonding pad 224 (two first bonding pads 224 are illustrated in FIG. 3) and at least a second bonding pad 226 (two second bonding pads 226 are illustrated in FIG. 3) disposed on the first active surface 222. The second chip 240 further comprises at least a third bonding pad 244 (two third bonding pads 244 are illustrated in FIG. 3) and at least a fourth bonding pad 246 (two fourth bonding pads 246 are illustrated in FIG. 3) disposed on the second active surface 242. The first bonding pads 224 diagonally correspond to the third bonding pads 244, and the second bonding pads 226 diagonally correspond to the fourth bonding pads 246.

In addition, the second wiring substrate 230 comprises at least a first conductive channel T1 (two are illustrated in FIG. 3) and at least a second conductive channel T2 (two are illustrated in FIG. 3). The first conductive channels T1 and the second conductive channels T2 pass through the dielectric layer 232 of the second wiring substrate 230 so that the first conductive channels T1 electrically connect the first wiring layer 234 to the second wiring layer 236 and the second conductive channels T2 electrically connect the first wiring layer 234 to the second wiring layer 236.

The first wiring layer 234 formed on the second wiring substrate 230 comprises at least a first circuit 234a (two are illustrated in FIG. 3) and at least a second circuit 234b (two are illustrated in FIG. 3). Each of the first circuits 234a may comprise a fifth bonding pad P5, a first peripheral bonding pad P1, and a first conductive trace L1 electrically connected between the fifth bonding pad P5 and the first peripheral bonding pad P1. Each of the second circuits 234b may comprise a sixth bonding pad P6, a second peripheral bonding pad P2, and a second conductive trace L2 electrically connected between the sixth bonding pad P6 and the second peripheral bonding pad P2.

The second wiring layer 236 formed on the second wiring substrate 230 comprises at least a third circuit 236a (two are illustrated in FIG. 3) and at least a fourth circuit 236b (two are illustrated in FIG. 3). Each of the third circuits 236a may comprise a seventh bonding pad P7 which is arranged to be diagonal to the fifth bonding pad P5, a third peripheral bonding pad P3, and a third conductive trace L3 electrically connected between the seventh bonding pad P7 and the third peripheral bonding pad P3. Each of the fourth circuits 236b may comprise a eighth bonding pad P8 which is arranged to be diagonal to the sixth bonding pad P6, a fourth peripheral bonding pad P4, and a fourth conductive trace L4 electrically connected between the eighth bonding pad P8 and the fourth peripheral bonding pad P4.

The electrical connections of the above elements are further described in the following paragraphs. In this embodiment, each of the first bonding pads 224 is electrically connected to the first wiring substrate 210 through the corresponding first circuit 234a and the corresponding first conductive holder 252. Specifically, each of the first bonding pads 224 is electrically connected to the first wiring substrate 210 sequentially through the corresponding first electrical connection element 260, the fifth bonding pad P5, the first conductive trace L1, the first peripheral bonding pad P1, and the first conductive holder 252.

Each of the second bonding pads 226 is electrically connected to the first wiring substrate 210 through the corresponding second circuit 234b and the corresponding second conductive holder 254. Specifically, each of the second bonding pads 226 is electrically connected to the first wiring substrate 210 sequentially through the corresponding first electrical connection element 260, the sixth bonding pad P6, the second conductive trace L2, the second peripheral bonding pad P2, and the second conductive holder 254.

Each of the third bonding pads 244 is electrically connected to the first wiring substrate 210 through the corresponding third circuit 236a, the corresponding first conductive channel T1, and the corresponding first conductive holder 252. Specifically, each of the third bonding pads 244 is electrically connected to the first wiring substrate 210 sequentially through the corresponding second electrical connection element 270, the seventh bonding pad P7, the third conductive trace L3, the third peripheral bonding pad P3, the corresponding first conductive channel T1, the corresponding first peripheral bonding pad P1, and the corresponding first conductive holder 252.

Each of the fourth bonding pads 246 is electrically connected to the first wiring substrate 210 through the corresponding fourth circuit 236b, the corresponding second conductive channel T2, and the corresponding second conductive holder 254. Specifically, each of the fourth bonding pads 246 is electrically connected to the first wiring substrate 210 sequentially through the corresponding second electrical connection element 270, the eighth bonding pad P8, the fourth conductive trace L4, the fourth peripheral bonding pad P4, the corresponding second conductive channel T2, the corresponding second peripheral bonding pad P2, and the corresponding second conductive holder 254.

Figure 4:
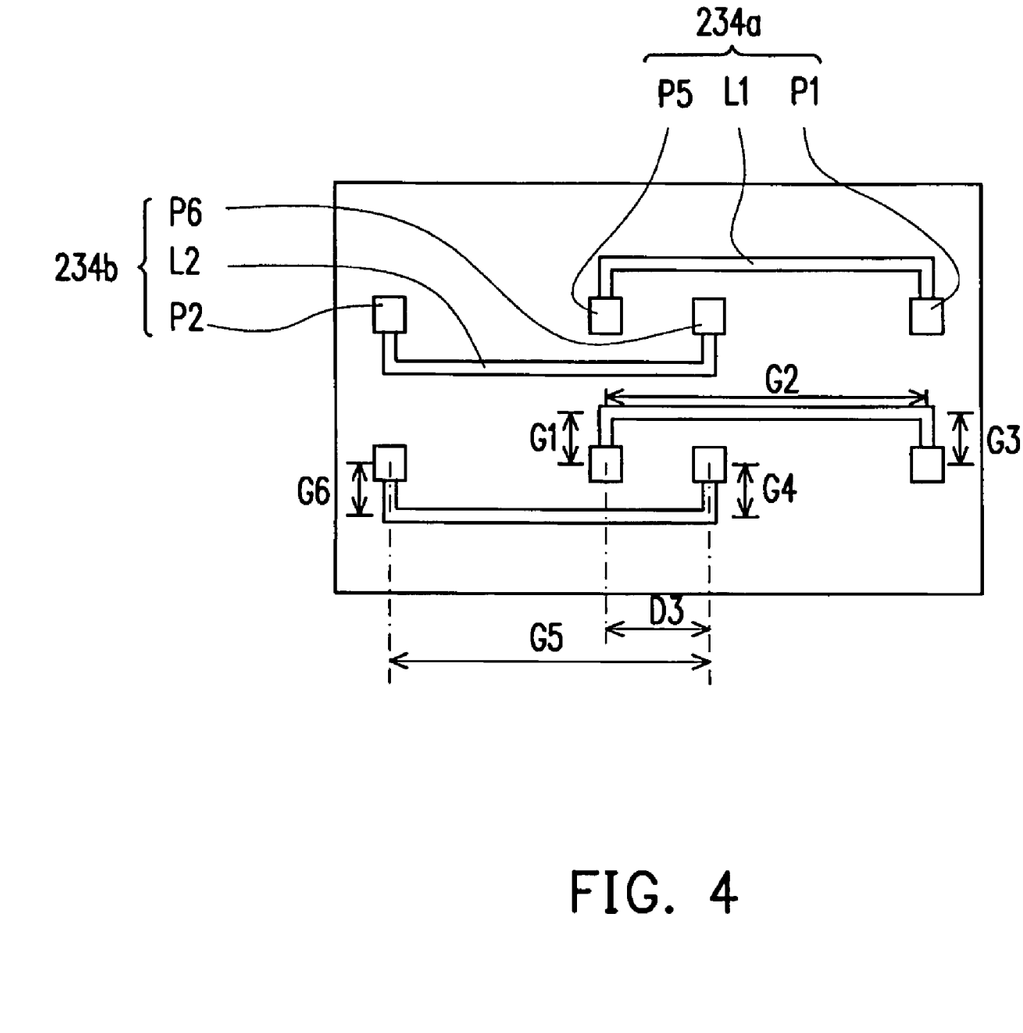
FIG. 4 is a bottom view of the second wiring substrate in FIG. 3.
Figure 5:
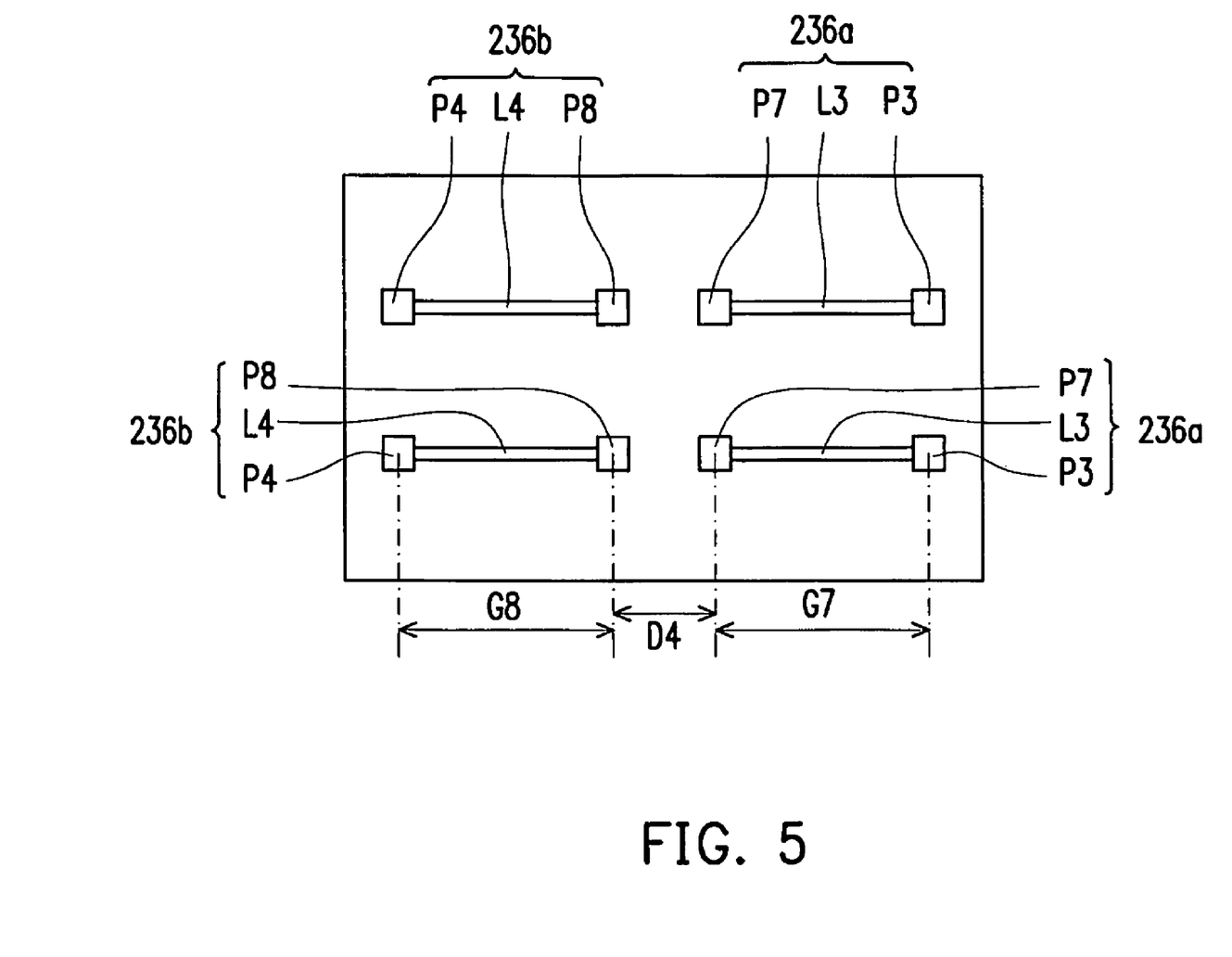
FIG. 5 is a top view of the second wiring substrate in FIG. 3.

FIG. 4 is a bottom view of the second wiring substrate in FIG. 3. FIG. 5 is a top view of the second wiring substrate in FIG. 3. Referring to FIG. 2, FIG. 3, FIG. 4, and FIG. 5, in this embodiment, a width of the first circuit 234a is larger than or equal to 20 micrometers and smaller than or equal to 40 micrometers, a width of the second circuit 234b is larger than or equal to 20 micrometers and smaller than or equal to 40 micrometers, a width of the third circuit 236a is larger than or equal to 20 micrometers and smaller than or equal to 40 micrometers, and a width of the fourth circuit 236b is larger than or equal to 20 micrometers and smaller than or equal to 40 micrometers. In addition, the materials of the first wiring layer 234 and the second wiring layer 236 comprise copper.

Copper has better electrical conductivity than gold. Moreover, the second wiring substrate 230 does not need to be fabricated in a clean room. Hence, when compared with a redistribution layer of a conventional chip, the second wiring substrate 230 according to this embodiment has better signal transmission efficiency and requires lower fabrication costs.

In this embodiment, a first space D1 between each of the first bonding pads 224 and the corresponding second bonding pad 226 is larger than 0 and smaller than or equal to 100 micrometers. A third space D3 between each of the fifth bonding pads P5 and the corresponding sixth bonding pad P6 is larger than 0 and smaller than or equal to 100 micrometers. A second space D2 between each of the third bonding pads 244 and the corresponding fourth bonding pad 246 is larger than 0 and smaller than or equal to 100 micrometers. A fourth space D4 between each of the seventh bonding pads P7 and the corresponding eighth bonding pad P8 is larger than 0 and smaller than or equal to 100 micrometers. Further, a length of each of the first circuits 234a (i.e. a sum of distances G1, G2, and G3) is equal to a length of each of the second circuits 234b (i.e. a sum of distances G4, G5, and G6), and a length G7 of each of the third circuits 236a is equal to a length G8 of each of the fourth circuits 236b. In addition, a sum of the length G7 of each of the third circuits 236a and a height H1 of the corresponding first conductive channel T1 is equal to the length of each of the first circuits 234a (i.e. the sum of distances G1, G2, and G3). A sum of the length G8 of each of the fourth circuits 236b and a height H2 of the second conductive channel T2 is equal to the length of each of the second circuits 234b (i.e. the sum of distances G4, G5, and G6).

Based on the above, a path for signal transmission between the first bonding pads 224 and the first wiring substrate 210, a path for signal transmission between the second bonding pads 226 and the first wiring substrate 210, a path for signal transmission between the third bonding pads 244 and the first wiring substrate 210, and a path for signal transmission between the fourth bonding pads 246 and the first wiring substrate 210 are approximately equal in length. Consequently, the multi-chip stack package 200 according to this embodiment can avoid signal delay, which occurs in a conventional multi-chip stack package 100.

Figure 6:
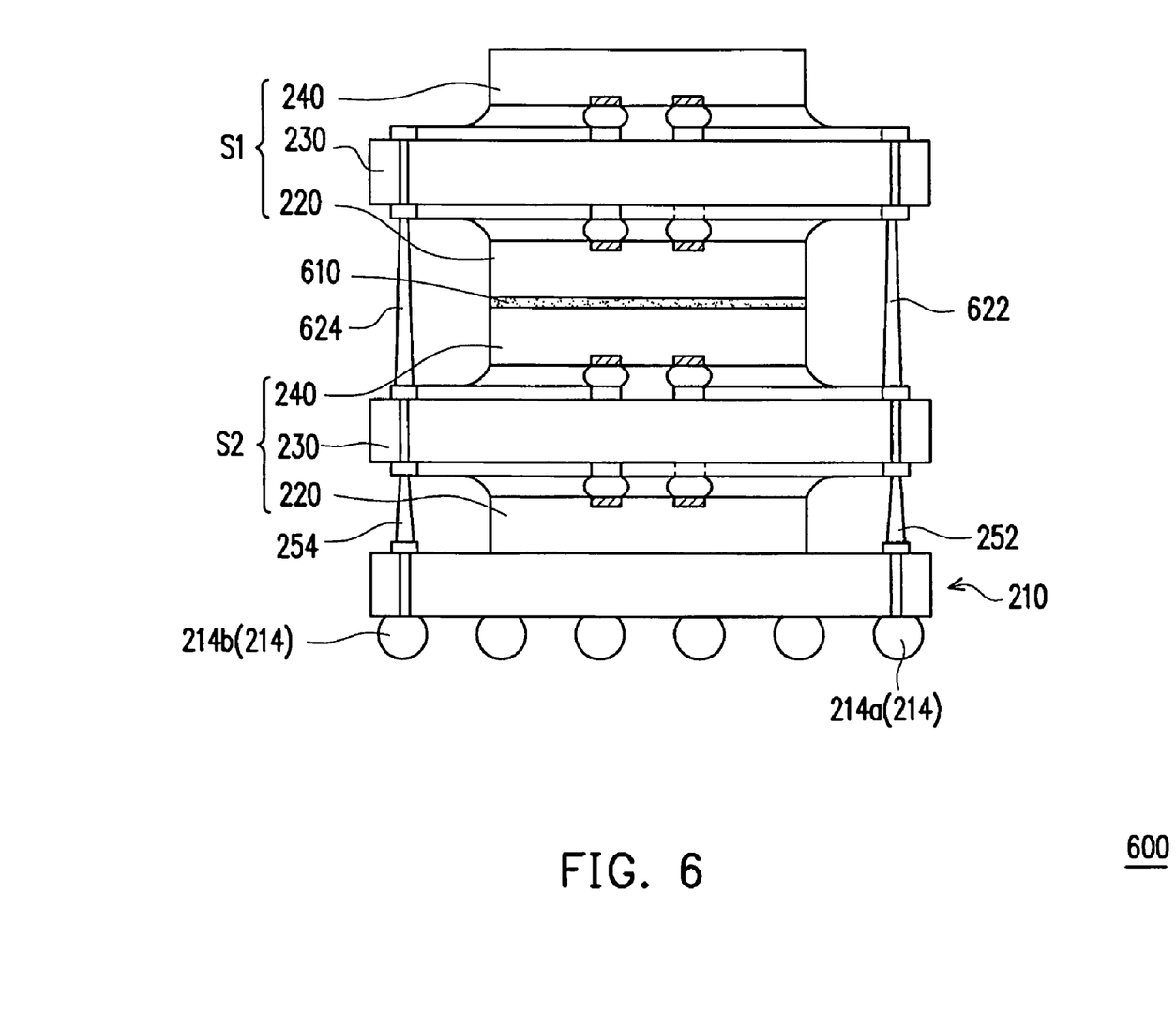
FIG. 6 is a schematic cross-sectional view of a multi-chip stack package according to another embodiment of the present invention.

FIG. 6 is a schematic cross-sectional view of a multi-chip stack package according to another embodiment of the present invention. Referring to FIG. 6, a multi-chip stack package 600 is similar to the multi-chip stack package 200 (refer to FIG. 2). The only difference lies in that the multi-chip stack package 600 comprises stack structures S1 and S2 which are formed by the first chip 220, the second wiring substrate 230, and the second chip 240. The stack structure S1 is above the stack structure S2. The first chip 220 of the stack structure S1 is disposed on the second chip 240 of the stack structure S2 through a bonding layer 610. In addition, the multi-chip stack package 600 further comprises at least a third conductive holder 622 and at least a fourth conductive holder 624. The third conductive holders 622 (a material thereof comprises gold) are disposed between the second wiring substrate 230 of the stack structure S1 and the second wiring substrate 230 of the stack structure S2 to electrically connect these second wiring substrates 230. The fourth conductive holders 624 (a material thereof comprises gold) are also disposed between the second wiring substrates 230 to electrically connect these second wiring substrates 230.

To conclude, the multi-chip stack package according to the embodiments of the present invention at least has one of the following advantages.

In the embodiment of the present invention, because the second wiring substrate comprises the first wiring layer and the second wiring layer, and the first chip and the second chip are electrically connected to the first wiring substrate respectively through the first wiring layer and the second wiring layer, the first chip and the second chip do not require the additional redistribution layer. Therefore, the fabrication costs of the multi-chip stack package according to the embodiment of the present invention are lower, and the utilization of the wafer divided into the first chip and the second chip can be enhanced.

According to the embodiment of the present invention, the width of each of the circuits on the second wiring substrate (between 20 to 40 micrometers) is larger than the circuit width (between 5 to 10 micrometers) on the redistribution layer in the conventional chip, and the materials of the circuits on the second wiring substrate comprise copper which has better electrical conductivity than gold. Moreover, the second wiring substrate does not need to be fabricated in a clean room. When compared with the redistribution layer in the conventional chip, the second wiring substrate according to the embodiment of the present invention has better signal transmission efficiency and requires lower fabrication costs.

According to the embodiment of the present invention, the path for signal transmission between the first bonding pads and the first wiring substrate, the path for signal transmission between the second bonding pads and the first wiring substrate, the path for signal transmission between the third bonding pads and the first wiring substrate, and the path for signal transmission between the fourth bonding pads and the first wiring substrate are approximately equal in length. Consequently, the multi-chip stack package according to the embodiment of the present invention can avoid signal delay, which occurs in the conventional multi-chip stack package.

According to the embodiment of the present invention, the first conductive channels and the second conductive channels do not need to be re-routed in the first wiring substrate to prevent the problem of signal delay, which occurs in a conventional multi-chip stack package.

The present invention has been disclosed by the above embodiments. However, they are not intended to limit the present invention. Persons of ordinary knowledge in the art may make some modifications and alterations without departing from the scope and spirit of the present invention. Therefore, the protection range sought by the present invention falls within the appended claims.

What is claimed is:

1. A multi-chip stack package, comprising:
    a first wiring substrate with a front side and a rear side, the first wiring substrate comprising a first solder ball and a second solder ball disposed on the rear side of the first wiring substrate;
    a first chip disposed on the front side of the first wiring substrate and electrically connected to the first wiring substrate, the first chip having a first active surface, the first chip further comprising a first bonding pad and a second bonding pad disposed on the first active surface, wherein the first bonding pad is electrically connected to the first solder ball, and the second bonding pad is electrically connected to the second solder ball;
    a second wiring substrate disposed on the first active surface of the first chip and electrically connected to the first wiring substrate; and
    a second chip disposed on the second wiring substrate and electrically connected to the second wiring substrate, wherein the second active surface of the second chip faces the first active surface of the first chip.

2. The multi-chip stack package as claimed in claim 1, wherein the second chip further comprises a third bonding pad and a fourth bonding pad disposed on the second active surface, the third bonding pad is electrically connected to the first solder ball, the fourth bonding pad is electrically connected to the second solder ball, the first and the third bonding pads are diagonally arranged, and the second and the fourth bonding pads are diagonally arranged.

3. The multi-chip stack package as claimed in claim 1, wherein the second wiring substrate further comprises a first wiring layer and a second wiring layer, the first wiring layer and the second wiring layer respectively disposed on opposite sides of the second wiring substrate.

4. The multi-chip stack package as claimed in claim 3, wherein the first wiring layer is redistribution layer.

5. The multi-chip stack package as claimed in claim 1 further comprising a plurality of first electrical connection elements disposed between the first chip and the second wiring substrate to electrically connect the first chip to the first wiring layer of the second wiring substrate.

6. The multi-chip stack package as claimed in claim 5, wherein each of the first electrical connection elements is a conductive bump.

7. The multi-chip stack package as claimed in claim 1 further comprising a plurality of second electrical connection elements disposed between the second chip and the second wiring substrate to electrically connect the second chip to the second wiring layer of the second wiring substrate.

8. The multi-chip stack package as claimed in claim 7, wherein each of the second electrical connection elements is a conductive bump.

* * * * *